(12) United States Patent
Capsal et al.

(10) Patent No.: US 10,131,765 B2
(45) Date of Patent: Nov. 20, 2018

(54) METHOD FOR MANUFACTURING COMPOSITE MATERIAL POLARIZABLE UNDER THE ACTION OF A WEAK ELECTRIC FIELD

(71) Applicant: Institut National Des Sciences Appliquees De Lyon, Villeurbanne (FR)

(72) Inventors: Jean-Fabien Capsal, La Mulatiere (FR); Jeremy Galineau, Morestel (FR); Pierre-Jean Cottinet, Limas (FR); Mickael Lallart, Villeurbanne (FR); Daniel Guyomar, Villeurbanne (FR)

(73) Assignee: INSTITUT NATIONAL DES SCIENCES APPLIQUEES DE LYON, Villeurbanne (FR)

( * ) Notice: Subject to any disclaimer, the term of this patent is extended or adjusted under 35 U.S.C. 154(b) by 508 days.

(21) Appl. No.: 14/784,918

(22) PCT Filed: Apr. 18, 2014

(86) PCT No.: PCT/EP2014/057997
§ 371 (c)(1),
(2) Date: Oct. 15, 2015

(87) PCT Pub. No.: WO2014/170479
PCT Pub. Date: Oct. 23, 2014

(65) Prior Publication Data
US 2016/0145414 A1    May 26, 2016

(30) Foreign Application Priority Data
Apr. 18, 2013  (FR) ...................... 13 53537

(51) Int. Cl.
| | |
|---|---|
| *H01L 41/187* | (2006.01) |
| *C08K 5/12* | (2006.01) |
| *C08F 214/22* | (2006.01) |
| *C08K 5/098* | (2006.01) |
| *H01L 41/09* | (2006.01) |
| *H01L 41/193* | (2006.01) |

(52) U.S. Cl.
CPC .............. *C08K 5/12* (2013.01); *C08F 214/22* (2013.01); *C08K 5/098* (2013.01); *H01L 41/0926* (2013.01); *H01L 41/193* (2013.01)

(58) Field of Classification Search
None
See application file for complete search history.

(56) References Cited

U.S. PATENT DOCUMENTS 2,964,501 A * 12/1960 Sarofeen ................. C08F 18/08
260/DIG. 15
3,003,982 A * 10/1961 Lindsey .................... C08J 7/047
524/141

(Continued)

FOREIGN PATENT DOCUMENTS

JP       9-78038 A  *  3/1997  ................ C09J 7/02

*Primary Examiner* — Thomas Dougherty
(74) *Attorney, Agent, or Firm* — Womble Bond Dickinson (US) LLP

(57) ABSTRACT

The present invention relates to a composite (13), characterized in that it comprises:
- at least one ferroelectric organic polymer with relaxation properties, and
- at least one phthalate-based plasticizer.

15 Claims, 4 Drawing Sheets

(56) References Cited

U.S. PATENT DOCUMENTS

| | | | | | |
|---|---|---|---|---|---|
| 3,455,805 | A | * | 7/1969 | May | C09D 5/44 204/492 |
| 3,847,854 | A | * | 11/1974 | Canter et al. | C08K 5/0016 138/177 |
| 5,024,975 | A | * | 6/1991 | Hartmann | C03C 3/091 428/209 |
| 5,096,784 | A | * | 3/1992 | Culbertson | C08J 7/047 428/141 |
| 5,114,739 | A | * | 5/1992 | Culbertson | C08J 7/047 427/171 |
| 5,686,124 | A | * | 11/1997 | Møller | A23L 13/432 426/442 |
| 7,553,802 | B2 | * | 6/2009 | Tanaglia | C08F 8/50 508/591 |
| 2010/0148632 | A1 | * | 6/2010 | Boersma | H01L 41/193 310/328 |

* cited by examiner

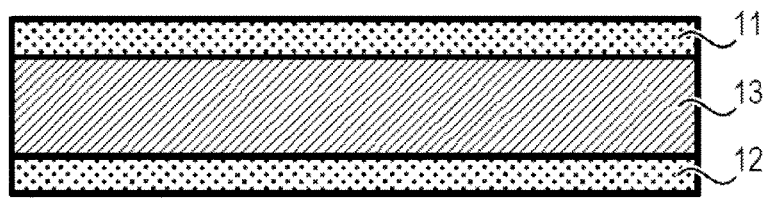
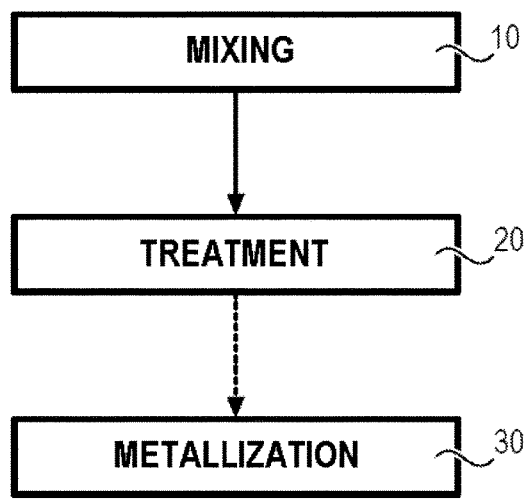

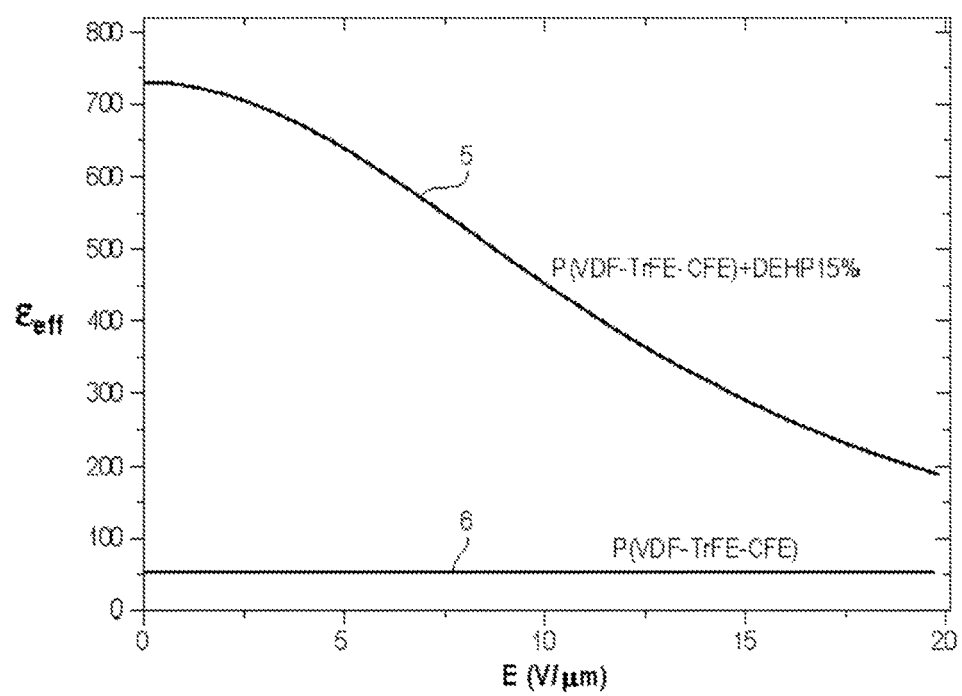
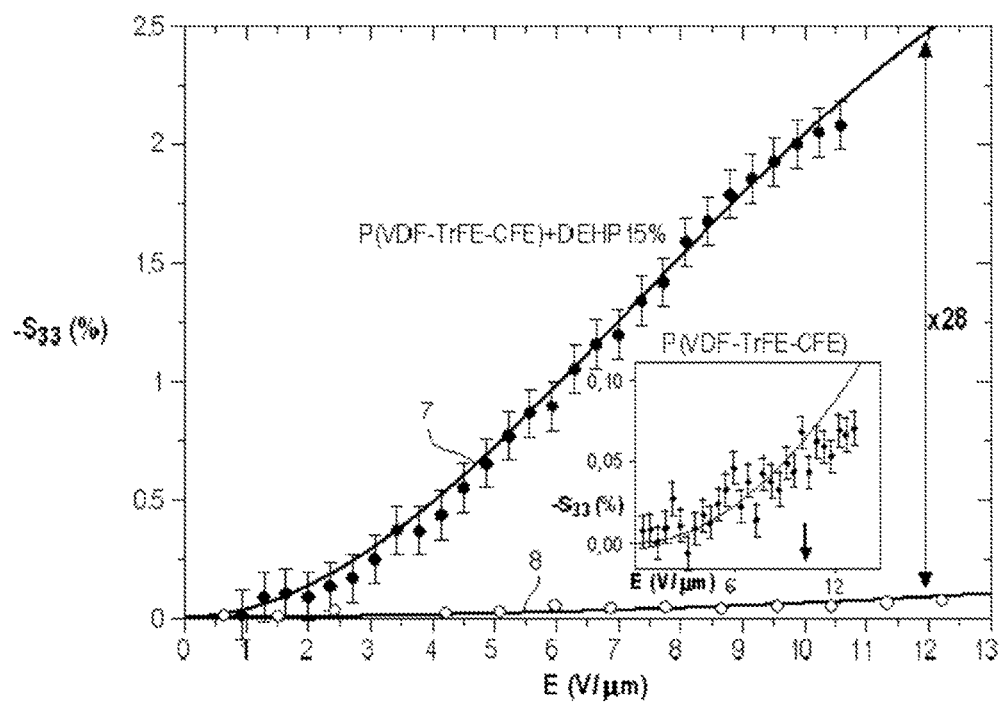

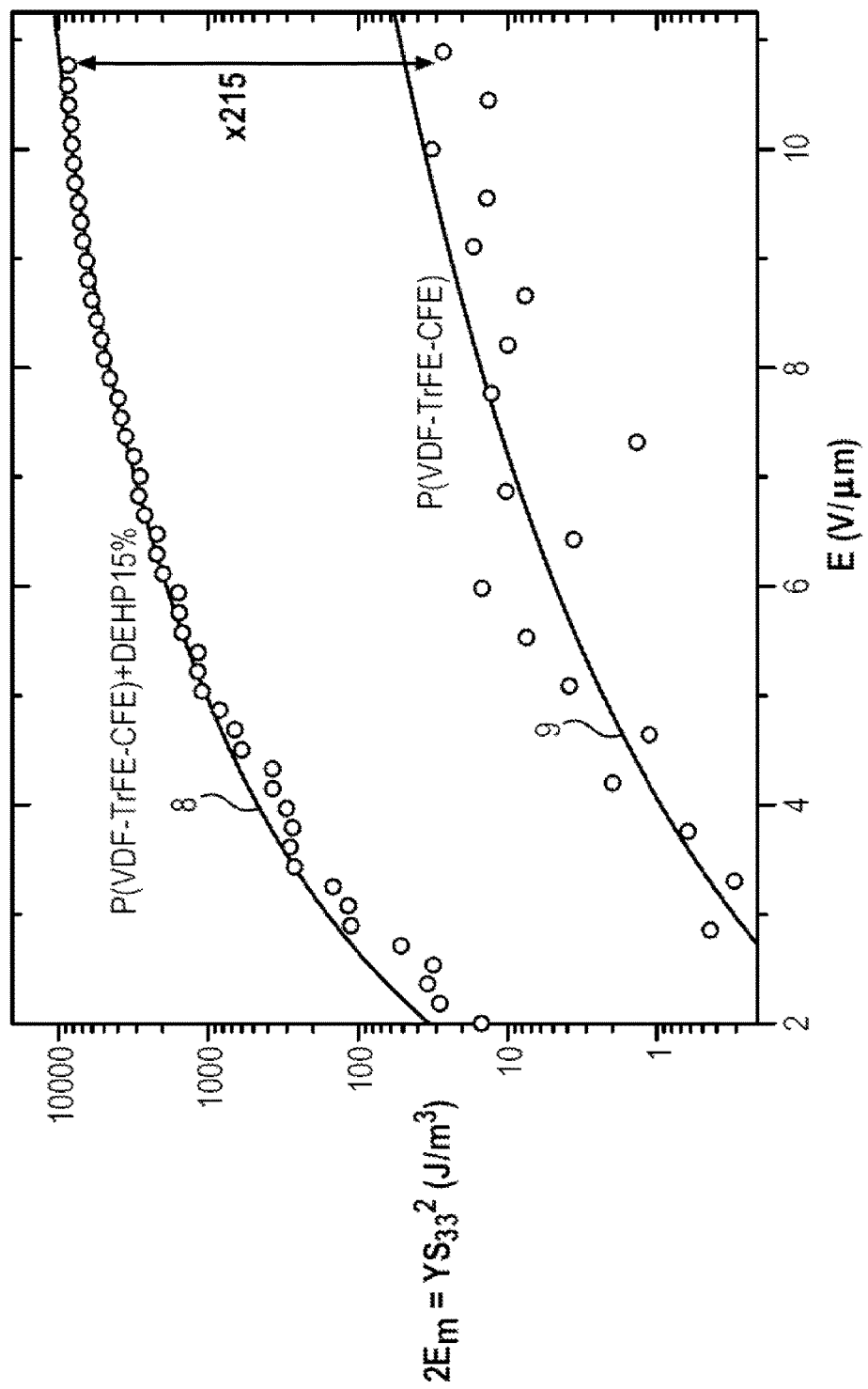

METHOD FOR MANUFACTURING COMPOSITE MATERIAL POLARIZABLE UNDER THE ACTION OF A WEAK ELECTRIC FIELD

FIELD OF TECHNOLOGY

The present invention relates to the field of technology of composites polarizable under the action of an electric field, and more particularly, composites comprising a ferroelectric organic polymer having relaxation character.

Relaxation character of a polymer means:
  that the barrier of transformation between the polar and nonpolar phases of the latter is diffuse and
  that at room temperature a reversible change between these phases may be induced under the action of an electric field, with very little hysteresis.

The ferroelectric organic polymers displaying a relaxation character must also possess good mechanical elasticity allowing considerable deformation under the action of an electric field.

PRIOR ART

Ferroelectric organic polymers displaying a relaxation character are known, such as terpolymers comprising:
  a first monomer of vinylidene fluoride (VDF), combined with
  a second monomer selected from trifluoroethylene (TrFE) or tetrafluoroethylene (TFE), combined with
  a third monomer selected from chlorofluoro-1,1-ethylene (CFE) or chlorotrifluoroethylene (CTFE).

The high level of the electric fields to be applied to these polymers constitutes a major obstacle for developing numerous applications, notably for fabricating actuators.

In fact, electrical voltages necessary for these applications must be low, especially in the fields of biology, electronics, robotics, haptics, etc. for correct, effective and safe use.

To reduce this requirement of a high electric field, solutions of composite materials have been proposed. They consist of a mixture of the terpolymer and of a conductive material, notably to increase the dielectric constant of the composite incorporating the terpolymer.

However, the dielectric strengths of such composites are low, and the influence of the conductive particles on the electromechanical properties is limited. Finally, the manufacture of such composites is expensive and poorly reproducible industrially.

One of the aims of the present invention is to overcome at least one of the drawbacks of the aforementioned materials and methods of manufacture.

Notably, one aim of the present invention is to propose a composite:
  having electrical induction equivalent to that of the pure material but under a weaker electric field,
  having electromechanical deformation equivalent to that of the pure material but under a weaker electric field,
  having a dielectric strength greater than that of the composites including a mixture of the terpolymer and of conductive material,
  having electromechanical coupling equivalent to that of the pure material but under a weaker electric field.

Another aim of the present invention is to propose a method for manufacturing for composite material that is reliable, inexpensive and reproducible.

SUMMARY OF THE INVENTION

For this purpose the invention relates to a composite comprising:

at least one ferroelectric organic polymer with relaxation properties, and
at least one phthalate-based plasticizer.

In the context of the present invention, "ferroelectric organic polymer with relaxation properties" means a polymer having a dielectric constant at least equal to 30 at room temperature, the dielectric constant varying under the electric field and in frequency, for example varying by 50% under an electric field of 80 V/μm at a frequency of 0.1 Hz. This polymer is characterized by a reversible change in molecular conformation of the crystalline phase.

On mixing the ferroelectric organic polymer with relaxation properties in polar phase with a phthalate-based plasticizer of low polarity that interacts with the polar phase of the pure polymer, the values of the fields necessary for actuating the novel composite are decreased in comparison with the pure material. The dielectric permittivity of the composite obtained is greatly increased.

Document US 2010/0148632 describes the use of plasticizer in a polymer for increasing the electrical activity of the composition thus obtained.

The polymer may be polyvinylidene fluoride, polyepichlorohydrin, polysaccharide or a mixture of these compounds (in particular amylose, amylopectin, cellulose), polyvinyl alcohol, poly(vinyl chloride), polysulfone, polycarbonate, polyester (in particular poly(ethylene terephthalate)), protein (such as casein), polyacrylonitrile, polyalkyl oxide (in particular a polyethylene oxide), polyamide, poly(hexamethylene-adipamide), aromatic urethane, aromatic urethane acrylate, alkyl acrylate, polyvinylpyrrolidone, polyethyloxazoline, and copolymers and mixtures of these polymers.

Moreover, the plasticizer may be a mono- or polyfunctional alcohol, an anhydride, an aldehyde or a ketone, a sulfide-based plasticizer, an amide of carboxylic acid, an organic nitrile, an amine, a cyanocarboxylic acid, an aromatic compound including a nitrile group, a carbonate, etc.

Thus, US 2010/0148632 teaches a person skilled in the art that mixing any plasticizer with any polymer makes it possible to increase the electrical activity of the composition thus obtained.

According to US 2010/0148632, this is due to an increase in mobility of the chains in the polymer as a result of adding plasticizer.

Referring to example 3 of US 2010/0148632, it can be seen that by adding a plasticizer of the dibutyl phthalate type to a polymer of the poly(vinyl chloride) type, the effective relative dielectric permittivity increases by a factor of 2 relative to the pure polymer.

In the context of the present invention, selecting:
  a particular type of polymer—namely a ferroelectric polymer having relaxation behavior—and
  a particular type of plasticizer—namely a phthalate-based plasticizer makes it possible to increase the effective relative dielectric permittivity by a factor of 16.

In fact, it is notably the relaxation character of the polymer that allows such results to be obtained. The importance of the relaxation character of the polymer is neither described nor taught in US 2010/0148632.

Preferred but nonlimiting aspects of the composite according to the invention are as follows:
  the ferroelectric organic polymer with relaxation properties is a polymer with relative permittivity above 40 for a frequency of 100 mHz and a temperature of 25° C.;
  the ferroelectric organic polymer with relaxation properties is a terpolymer based on:

vinylidene difluoride (VDF),
trifluoroethylene (TrFE), and
chlorofluoro-1,1-ethylene (CFE) or chlorotrifluoroethylene (CTFE);
the phthalate-based plasticizer is bis(2-ethylhexyl) phthalate (DEHP);
the phthalate-based plasticizer represents from 5 to 30 wt % relative to the total weight of the composite;
the ferroelectric organic polymer with relaxation properties represents from 70 to 95 wt % relative to the total weight of the composite;
the state of electrical induction is of at least 50 mC/m$^2$ under an electric field of 20 V/μm.

The invention also relates to a method for manufacturing a composite, notable in that it comprises:
a step of mixing at least one ferroelectric organic polymer with relaxation properties and at least one phthalate-based plasticizer to obtain a mixture, and
a step of treatment of the mixture to obtain the composite.

In particular, said treatment step may include a substep consisting of producing a film from the mixture and a substep consisting of drying and annealing said film.

Preferred but nonlimiting aspects of the method of manufacture according to the invention are as follows:
the mixing step is carried out by the solvent route and comprises the substeps consisting of:
dissolving the ferroelectric organic polymer with relaxation properties and the phthalate-based plasticizer in at least one solvent common to the plasticizing ferroelectric organic polymer with relaxation properties and to the phthalate-based plasticizer,
removing said at least one solvent;
the mixing step is carried out by the melt route;
the treatment step comprises a substep of annealing the mixture obtained at the end of the mixing step, the substep of annealing consisting of heating:
to a temperature below the melting point of the mixture, and
for a time greater than or equal to one minute;
the method further comprises a step consisting of depositing electrodes on the composite material.

The invention also relates to an actuating element notable in that it comprises a component including the composite material as described above, and at least two electrodes connected to said component and mutually insulated, where said actuating element can be curved and deformed by application of a difference in electrical potential between the two electrodes.

BRIEF DESCRIPTION OF THE FIGURES

Other features, aims and advantages of the present invention will become clearer from the description given below, which is purely illustrative and nonlimiting and must be read with reference to the appended drawings, in which:
FIG. 1 illustrates an example of composite structure including a composite material,
FIG. 2 illustrates an example of a method for manufacturing a composite material,
FIGS. 3 to 6 are curves illustrating the behavior of a pure terpolymer and of a composite material composed of the pure terpolymer mixed with 15 wt % of bis(2-ethylhexyl) phthalate relative to the total weight of the composite.

DETAILED DESCRIPTION

Figure 3:
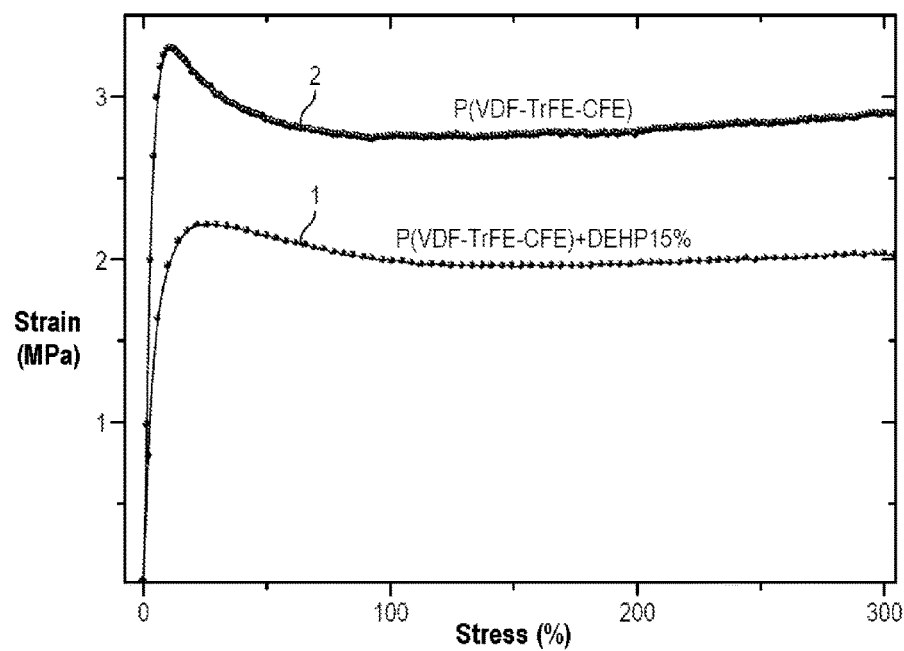

The composite material and its associated method of manufacture will now be described in more detail, referring to FIGS. 1 and 2.

Referring to FIG. 1, a composite structure is illustrated. This structure comprises a layer of composite material 13 inserted between two electrically conducting layers 11, 12 forming the electrodes.

The layer of composite material 13 comprises a mixture of one or more ferroelectric organic polymers with relaxation behavior, and of one or more phthalate-based plasticizers.

The polymer is for example a P(VDF-TrFE-CFE) terpolymer or a P(VDF-TrFE-CTFE) terpolymer.

The plasticizer is for example bis(2-ethylhexyl) phthalate (or DEHP, for DiEthylHexyl Phthalate).

By mixing a polar phase terpolymer—such as a P(VDF-TrFE-CFE) terpolymer or a P(VDF-TrFE-CTFE) terpolymer—with another material of low polarity—such as a phthalate-based plasticizer—that interacts with the polar phase of the terpolymer, it is possible to increase the dielectric permittivity of the composite obtained.

The inventors in fact discovered that mixing a polymer of the organic ferroelectric type with relaxation behavior with a phthalate-based plasticizer makes it possible to increase the dielectric permittivity of the composite obtained, and therefore, for example for a terpolymer based on VDF, TrFE and CFE (or CTFE) with a terpolymer/plasticizer mixture 85/15 in wt %:
to attain a state of electrical induction of at least 75 mC/m$^2$ under an electric field of 20 V/μm, i.e. a voltage 10 times lower than for the pure terpolymer based on VDF, TrFE and CFE (or CTFE),
to go from a relative permittivity of about 50 for the pure terpolymer based on VDF, TrFE and CFE (or CTFE), to a relative permittivity of about 725 in the case of the composite material,
to increase the electromechanical response by a factor of 28 (and therefore decrease the field required or increase the deformation at constant field) and the associated mechanical energy density by a ratio of 215 relative to the pure terpolymer based on VDF, TrFE and CFE (or CTFE).

Preferably, the phthalate-based plasticizer represents from 5 to 30 wt % relative to the total weight of the composite material 13, and the ferroelectric organic polymer with relaxation properties represents from 70 to 95 wt % relative to the total weight of the composite material 13. This allows an increase in the free volume of the polymer chains while guaranteeing good mechanical durability of the composite material.

Referring to FIG. 2, the method of manufacture comprises:
i) a step 10 of mixing, by the solvent route or by the melt route:
a terpolymer based on monomers of VDF (vinylidene difluoride), of TrFE (trifluoroethylene) and of CFE (chlorofluoro-1,1-ethylene) or of CTFE (chlorotrifluoroethylene), with
a liquid plasticizer of the phthalate class (DEHP for example).
ii) a step of treatment 20 of the mixture in which:
a film is produced from the mixture by conventional techniques such as techniques of casting by the solvent or melt route,
the film is dried and annealed appropriately for crystallizing it; notably annealing may consist of heating:
to a temperature below the melting point of the mixture, and
for a time greater than or equal to one minute,
electrodes are affixed on the film (step 30).

The method of manufacture described above makes it possible to obtain polymers having electrical induction equivalent to the pure material, but obtained under weaker electric fields.

In a preferred embodiment example of the method according to the invention, the P(VDF-TrFE-CFE) terpolymer (or the P(VDF-TrFE-CTFE) terpolymer) is mixed with "a" % of DEHP.

The P(VDF-TrFE-CFE) terpolymer (or P(VDF-TrFE-CTFE) terpolymer) mixed with "a" % of DEHP is composed of "x" mol % of VDF, of "y" mol % of TrFE and of "100-x-y" mol % of CFE (or of CTFE), where "x" is between 20 and 40 and where the sum of "x" and "y" is between 90 and 97. The value of "a" is between 1 and 30%.

As an example, the P(VDF-TrFE-CFE) terpolymer mixed with DEHP is composed of:
61.8 mol % of VDF,
29.8 mol % of TrFE and
8.5 mol % of CFE.

A study carried out by the inventors, which allows better understanding of the advantages of the invention, will now be presented in more detail.

Theory Relating to the Invention

To present the advantages associated with the present invention, the P(VDF-TrFE-CFE) terpolymer was used. This material has aroused increasing interest in recent years on account of its ferroelectric relaxation behavior, its high dielectric permittivity ($\epsilon_r \sim 50$) and its high electromechanical activity. The high dielectric permittivity of this polymer is due to interactive dipolar orientation within the crystalline phase of the polymer, which leads to a ferroelectric material with relaxation behavior.

In this study, the P(VDF-TrFE-CFE) terpolymer was chemically modified using bis(2-ethylhexyl) (DEHP).

Investigation of this modified terpolymer shows an increase in the electrostrictive stress under a weak applied electric field by a factor of 28 relative to the pure terpolymer. Investigation of this modified terpolymer also shows that its mechanical energy is increased by a factor of 233 relative to the pure terpolymer.

This simple chemical modification makes it possible to utilize the natural properties of the terpolymer at an electric field 5.5 times weaker than that of the pure terpolymer. Moreover, the cost associated with the proposed modification (i.e. mixing the pure terpolymer with a plasticizer) is low.

It has already been shown that in the case of dielectric polymers, the electrostrictive stress under an electric field can mainly be attributed to Maxwell forces induced by the dipolar orientation within the material. In the longitudinal direction, the compressive Maxwell strain and the mechanical energy density under the electric field are given by equations (1) and (2) below:

$$S_{33} = \frac{\epsilon \epsilon_0}{2Y}(1-2v)E^2 \quad \text{(EQUATION 1)}$$

$$E_m = \frac{1}{2}YS_{33}^2 \quad \text{(EQUATION 2)}$$

where:
$S_{33}$ is the longitudinal strain in the direction of the thickness,
$E_m$ is the mechanical energy density,
$\epsilon$ is the relative dielectric constant of the material, variable in frequency and in electric field,
$\epsilon_0$ is the dielectric permittivity of a vacuum,
v is Poisson's ratio of the material,
Y is the Young's modulus of the material,
E is the electric field applied to the material.

It will be understood from equation (1) that the value of the large electric fields usually necessary to reach a sufficient electrostrictive strain (some percent) can be reduced:
by reducing the Young's modulus of the polymer and/or
by increasing the dielectric permittivity of the polymer.

However, for applications as low-frequency actuators, the mechanical energy density must also be reinforced.

Thus, the increase in the deformation stress must be greater than the decrease in the elasticity (Young's modulus) of the material.

Plasticizers are dielectric chemical molecules commonly used with polymers for their plasticizing effects.

However, in the context of the present invention, the plasticizer is used for other reasons. Notably, chemical modification of the polymer with a plasticizer leads to an increase in molecular mobility in the modified polymer, causing a decrease in Young's modulus.

Polymers are heterogeneous systems by nature. From the electrical standpoint, above the glass transition temperature and under an applied electric field, the increase in molecular mobility allows the charges to be trapped within the confines of the heterogeneities in the modified polymer.

In the case of semicrystalline polymers, the charges trapped at the amorphous/crystalline phase boundaries induce large effects of Maxwell Wagner Sillars electrical induction. This type of electrical induction is associated with a large increase in dielectric permittivity at low frequency.

Thus, control of the molecule of plasticizer and of the polymer matrix (phase heterogeneities, Young's modulus, and dielectric permittivity) allows the generation of large macroscopic dipoles associated with phase heterogeneities and makes it possible to reduce the Young's modulus of the modified polymer, but also to increase its dielectric permittivity.

Thus, both the electrostrictive stress and the mechanical energy density of the material are increased.

The influence of the DEHP content on the mechanical elastic modulus (FIG. 3) of the terpolymer was characterized by a tensile strain as a function of measurements of stress.

Chemical modification of the P(VDF-TrFE-CFE) terpolymer increases the elastic strain of the material and decreases the breaking strain (curve 1) relative to the pure terpolymer (curve 2). These results are in agreement with an increase in molecular mobility in the material. The reader will appreciate that there is no influence of the DEHP content on the breaking strain of the polymer.

In contrast to the solutions proposed in the prior art for modifying a polymer, the modified terpolymer according to the invention is not weakened by chemical modification.

The Young's modulus of the P(VDF-TrFE-CFE) terpolymer is equal to 65 MPa. When the amount of DEHP mixed with the terpolymer increases, the Young's modulus of the modified terpolymer decreases. For 15 wt % of DEHP relative to the total weight of the modified terpolymer, the Young's modulus is equal to 20 MPa.

The reader will appreciate that mixing the P(VDF-TrFE-CFE) terpolymer with

DEHP causes very little change in the thermal and structural properties of the polymer, the melting point of the pure polymer being 127° C. whereas the melting point of the modified polymer is 120° C.

Figure 4A:
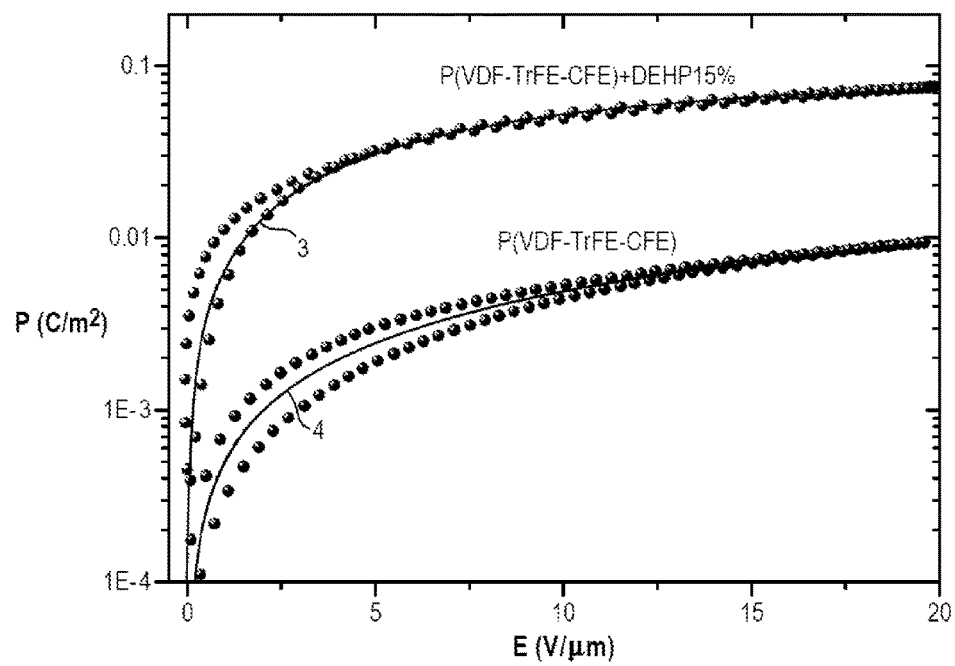

The dielectric properties of the pure terpolymer and of the modified terpolymer were also characterized by measuring the electrical induction as a function of the applied electric field at a frequency of 100 mHz (FIG. 4A).

For weak electric fields, the electrical induction of the modified terpolymer is greatly increased (curve 3) relative to the electrical induction of the pure terpolymer (curve 4), the latter ranging from 10 mC/m$^2$ at E=20 V/μm for the pure terpolymer to more than 75 mC/m$^2$ for the modified terpolymer (mixed with 15 wt % of DEHP).

The variation of the dielectric permittivity with the electric field was calculated using the Debye-Langevin method (FIG. 4B). Up to an electric field of 20 V/μm, the effective relative dielectric permittivity of the pure terpolymer remains roughly constant at ∈eff=50.

A large increase in dielectric permittivity at low field was observed for the modified terpolymer (curve 5) relative to the pure terpolymer (curve 6). For a higher electric field, the dielectric permittivity of the modified terpolymer changes from ∈eff=725 to ∈eff=190 for an electric field E=20 V/μm. Thus, even at high applied electric field, the dielectric permittivity of the modified terpolymer is still higher than the dielectric permittivity of the pure terpolymer.

Consequently, introducing DEHP into the polymer matrix tends to promote the interface phenomena caused by the charges trapped at the interface between the amorphous and crystalline phases. This interface phenomenon leads to large dipoles, which are responsible for the large increase in dielectric permittivity of the modified terpolymer.

The adjustment of the dielectric permittivity with the electric field can be regarded as early saturation of the Maxwell Wagner Sillars polarization effects.

Whereas the dielectric property of the pure terpolymer can be described as a two-phase system (amorphous dipolar phase and crystalline dipolar phase), each phase having a saturation electric field greater than 50 V/μm, the modified terpolymer can be regarded as a three-phase system (dipolar interfacial effects, amorphous dipolar phase and crystalline dipolar phase) with a saturation electric field of the dipolar interfacial effect much lower than that of the pure terpolymer, which despite everything leads to superior performance of the modified terpolymer.

The influence of DEHP on the electrostrictive response of the terpolymer was characterized by the longitudinal strain under an electric field (FIG. 5). The experimental data were compared with the compressive strains caused by the Maxwell stresses calculated from Young's modulus and the adjustable dielectric permittivities measured previously.

In both cases, the Maxwell stresses are very representative of the electrostrictive behavior of the pure and modified polymers (curves 7 and 8). For an electric field ranging from 0 to 13 V/μm:
the longitudinal strain of the pure terpolymer has a quadratic relationship with the electric field, whereas
the longitudinal strain of the modified terpolymer does not have a quadratic relationship with the electric field owing to the saturation of the interfacial phenomena.

For an electric field of 10 V/μm, the longitudinal strain is increased by a factor of 28 (from 0.07% for the pure terpolymer to 2% for the modified terpolymer with 15 wt % of DEHP). For comparison, the electric field required to reach a strain of 2% with the pure terpolymer is 55 V/μm.

Besides the increase in the polymer's electrostrictive strain response, an increase in the polymer's mechanical energy density must also be obtained in order to be able to use the latter in electro-active devices.

The proposed modification allows an improvement in the mechanical energy density of the active material. The mechanical energy densities Em of the pure and modified terpolymers were calculated from equation (2) (FIG. 6).

With a weak electric field E=11 V/μm, the mechanical energy density of the modified terpolymer (curve 8) is 215 times higher than that of the pure terpolymer (curve 9). At this electric field, the mechanical energy density of the modified terpolymer (15% DEHP) reaches 5000 J/m$^3$, whereas it is only 23 J/m$^3$ for the pure terpolymer.

In practical applications, DEHP allows a significant reduction (by 5.5 times) of the electric field. In consequence, the use of DEHP or of any other phthalate-based plasticizer is a realistic solution making it possible to take advantage of the physical properties of the terpolymer at much weaker electric fields than with the pure terpolymer.

The reader will have understood that numerous modifications may be made to the composite material and to the method of manufacture described above without departing materially from the new teachings and the advantages described here.

For example, in the above examples, the plasticizer was DEHP. Other types of plasticizers could be used, for example:
diisononyl phthalate (DINP), or
di-2 propyl heptyl phthalate (DPHP), or
diisodecyl phthalate (DIDP), or
any other plasticizer of the phthalate class known by a person skilled in the art.

Consequently, all the modifications of this type are intended to be incorporated within the scope of the appended claims.

The invention claimed is:
1. A composite material comprising:
at least one phthalate-based plasticizer, and
at least one ferroelectric organic polymer with relaxation properties, wherein the ferroelectric organic polymer with relaxation properties is a terpolymer based on:
vinylidene difluoride (VDF),
trifluoroethylene (TrFE), and
chlorofluoro-1,1-ethylene (CFE) or chlorotrifluoroethylene (CTFE).
2. The composite material as claimed in claim 1, wherein the ferroelectric organic polymer with relaxation properties is a polymer with relative permittivity above 40 for a frequency of 100 mHz and a temperature of 25° C.
3. The composite material as claimed in claim 1, wherein the phthalate-based plasticizer is bis(2-ethylhexyl) phthalate (DEHP).
4. The composite material as claimed in claim 1, wherein:
the phthalate-based plasticizer represents from 5 to 30 wt % relative to the total weight of the composite, and
the ferroelectric organic polymer with relaxation properties represents from 70 to 95 wt % relative to the total weight of the composite.
5. The composite material as claimed in claim 1, wherein the composite material has a state of electrical induction of at least 50 mC/m$^2$ under an electric field of 20 V/μm.
6. A method for manufacturing a composite, comprising:
mixing at least one ferroelectric organic polymer with relaxation properties and at least one phthalate-based plasticizer to obtain a mixture, wherein the ferroelectric organic polymer with relaxation properties is a terpolymer based on:
vinylidene difluoride (VDF),
trifluoroethylene (TrFE), and chlorofluoro-1,1-ethylene (CFE) or chlorotrifluoroethylene (CTFE), and treating the mixture to obtain the composite material.

7. The method of manufacture as claimed in claim 6, wherein the step of mixing is carried out by the solvent route and comprises the substeps consisting in:
dissolving the plasticizing ferroelectric organic polymer with relaxation properties and the phthalate-based plasticizer in at least one solvent common to the plasticizing ferroelectric organic polymer with relaxation properties and to the phthalate-based plasticizer,
removing said at least one solvent.

8. The method of manufacture as claimed in claim 6, wherein the step of mixing is carried out by the melt route.

9. The method of manufacture as claimed in claim 6, wherein the step of treating comprises a substep of annealing of the mixture obtained at the end of the mixing step, the substep of annealing consisting of heating:
to a temperature below the melting point of the mixture, and
for a time greater than or equal to one minute.

10. The method of manufacture as claimed in claim 6, which further comprises depositing electrodes on the composite material.

11. An actuating element comprising a component including:
a composite material comprising at least one ferroelectric organic polymer with relaxation properties, and at least one phthalate-based plasticizer, and
at least two electrodes connected to said component and mutually insulated,
said actuating element being curvable and deformable by application of a difference in electrical potential between the two electrodes.

12. A method for manufacturing a composite, comprising:
mixing at least one ferroelectric organic polymer with relaxation properties and at least one phthalate-based plasticizer to obtain a mixture,
treating the mixture to obtain the composite material,
depositing electrodes on the composite material.

13. The method of manufacture as claimed in claim 12, wherein the step of mixing is carried out by the solvent route and comprises the substeps consisting in:
dissolving the plasticizing ferroelectric organic polymer with relaxation properties and the phthalate-based plasticizer in at least one solvent common to the plasticizing ferroelectric organic polymer with relaxation properties and to the phthalate-based plasticizer,
removing said at least one solvent.

14. The method of manufacture as claimed in claim 12, wherein the step of mixing is carried out by the melt route.

15. The method of manufacture as claimed in claim 12, wherein the step of treating comprises a substep of annealing of the mixture obtained at the end of the mixing step, the substep of annealing consisting of heating:
to a temperature below the melting point of the mixture, and
for a time greater than or equal to one minute.

* * * * *